(12) United States Patent
Winegarden et al.

(10) Patent No.: US 8,629,006 B2
(45) Date of Patent: Jan. 14, 2014

(54) HYBRID INTEGRATED CIRCUITS AND THEIR METHODS OF FABRICATION

(75) Inventors: Steven Winegarden, Sunnyvale, CA (US); Ronald Nicholson, Santa Clara, CA (US); John Jun Yu, Los Altos, CA (US)

(73) Assignee: Agate Logic, Inc., Cupertino, CA (US)

( * ) Notice: Subject to any disclaimer, the term of this patent is extended or adjusted under 35 U.S.C. 154(b) by 948 days.

(21) Appl. No.: 11/634,039

(22) Filed: Dec. 5, 2006

(65) Prior Publication Data

US 2008/0132007 A1    Jun. 5, 2008

(51) Int. Cl.
*H01L 21/82*    (2006.01)
(52) U.S. Cl.
USPC ........................................................ 438/128
(58) Field of Classification Search
USPC ........................................................ 438/128
See application file for complete search history.

(56) References Cited

U.S. PATENT DOCUMENTS

| | | | |
|---|---|---|---|
| 5,526,278 A * | 6/1996 | Powell | 716/16 |
| 6,020,755 A * | 2/2000 | Andrews et al. | 326/39 |
| 7,356,799 B2 * | 4/2008 | Madurawe | 716/16 |

\* cited by examiner

*Primary Examiner* — Marvin Payen
(74) *Attorney, Agent, or Firm* — Buchanan Ingersoll & Rooney PC

(57) ABSTRACT

The present invention provides architectures for hybrid integrated circuits and methods for producing these hybrid integrated circuits that contain both field programmable gate arrays and mask programmable gate arrays, a form of application specific integrated circuits. Methods for producing an integrated circuit that is field programmable as well as mask programmable include the steps of: designing wafer bank layers and finishing layers, where the wafer bank layers provide a plurality of selectable functional blocks; fabricating said wafer bank layers; designing mask programmed interconnect layers for said integrated circuit, where the interconnect layers interconnect selected ones of the plurality of functional blocks from the wafer bank layers; fabricating the interconnect layers on the wafer bank layers; and fabricating the finishing layers on the interconnect layers to produce the integrated circuit. Architectures for these integrated circuits can contain a field programmable gate array that is integrated with a mask programmable gate array in a ring structure.

20 Claims, 5 Drawing Sheets

HYBRID INTEGRATED CIRCUITS AND THEIR METHODS OF FABRICATION

FIELD OF INVENTION

This invention relates to the integrated circuits, and, more particularly, to integrated circuits containing mask and field programmable gate arrays.

BACKGROUND OF INVENTION

At present, large or very large integrated circuits can be application specific integrated circuits (ASICS) or field programmable gate arrays (FPGAs). ASICs are integrated circuit customized during manufacturing for a particular use while FPGAs are arrays of logic elements and interconnects that are configured and manufactured such that the logic functions and interconnects are programmable in the field after the FPGAs are manufactured. FPGAs allow the customer the flexibility of defining the configuration of the gate arrays after manufacturing to accommodate a variety of field conditions and applications. However, FPGAs are generally slower and the density of elements in the FPGAs is lower and thus they are generally more expensive than ASICs.

Mask programmable gate arrays (MPGAs) are a form of ASIC that has become popular with the manufacturers. They have arrays of logic elements and other active components specified by the designer of the MPGA but the metallization layers i.e., the wire inter-connections between the elements or devices of the arrays are customized by a customer for a particular use and incorporated in the manufacturing of the MPGAs.

Generally for MPGAs, structurally, the designer defines the circuit and logic elements, such as shift registers, embedded cpus, arithmetic units, and counters and the customer selects the desired functionalities, which then defines the interconnection layers, such as the metal wire and via layers to customize the design of the integrated circuit for the user's application. Until the customer-defined interconnections are made, the array of devices is uncommitted and devoid of functionality. Since the majority of the layers of the circuit uses stock designs from a designer/manufacturer, only a minimal number of photo-lithographic masks for the interconnect layers has to be custom designed and made. Therefore, an application specific MPGA for a customer can be manufactured less expensively and more rapidly than a fully customized ASIC where each layer of the circuit is customized designed and fabricated for a specific customer. However, MPGA has the limitation that the customer customization occurs at the design stage. Here, the designer can be a vendor of the MPGAs designing the MPGAs in accordance with customer provided specification.

Existing designs of integrated circuits also do not allow a customer the flexibility of programming the input/out ports, either before or after manufacturing. This limits the capability and flexibility of the finished products.

Due to the limitations of the prior art, it is therefore desirable to have architectures and processes for producing such architectures and fabricating integrated circuits that would provide the flexibility of FPGAs, and the convenience and low cost manufacturing features of MPGAs.

SUMMARY OF INVENTION

An object of this invention is to provide architectures for integrated circuits and methods for fabricating large or very large integrated circuits that allow a customer the flexibility to incorporate customer designs and specifications into the design of the integrated circuit, both before and after the manufacturing of the integrated circuit.

Another object of this invention is to provide architectures for integrated circuits and methods for fabricating integrated circuits that are flexible yet inexpensive to manufacture.

Briefly, the present invention provides architectures for hybrid integrated circuits and methods for fabricating these hybrid integrated circuits that contain both field programmable gate arrays and mask programmable gate arrays. Methods for fabricating an integrated circuit that is field programmable as well as mask programmable include the steps of: designing wafer bank layers and finishing layers, where the wafer bank layers provide a plurality of selectable functional blocks; fabricating said wafer bank layers; designing mask programmed interconnect layers for said integrated circuit, where the interconnect layers interconnect selected ones of the plurality of functional blocks from the wafer bank layers; fabricating the interconnect layers on the wafer bank layers; and fabricating the finishing layers on the interconnect layers to produce the integrated circuit. The architecture for these integrated circuits may include a field programmable gate array that is integrated with a mask programmable gate array in a ring structure.

An advantage of this invention is that architectures for integrated circuits of this invention and methods to fabricate the integrated circuit of this invention allow a customer the flexibility to incorporate individual customized designs and specifications into the design of the integrated circuit, both before and after the manufacturing of the integrated circuit.

Another advantage of this invention is that the integrated circuits of this invention and methods that produce the integrated circuit of this invention are flexible, yet inexpensive to manufacture.

DESCRIPTION OF DRAWINGS

The foregoing and other objects, aspects and advantages of the invention will be better understood from the following detailed description of preferred embodiments of this invention when taken in conjunction with the accompanying drawings in which.

DETAILED DESCRIPTION OF THE PREFERRED EMBODIMENTS

The presently preferred architectures for integrated circuit or integrated circuits of this invention are hybrid architectures that comprise of one or more FPGAs, one or more MPGAs and a plurality of inputs and outputs (I/O) connected, either directly or indirectly, to said MPGAs and FPGAs.

A field programmable circuitry such as a gate array, device, or a portion of an integrated circuit allows a customer of said gate array, device, or integrated circuit to program a particular configuration, specification, or application after said circuitry has been manufactured.

Mask programmable or mask programmed, in the present discussion, may mean the ability to select, during the design process before the manufacture of the integrated circuit, certain functional (or circuit) blocks from a plurality of functional blocks available in the integrated circuit by designating the interconnections to and among the functional blocks. An MPGA allows a customer to select one or more of the functional blocks from a bank of functional blocks that are available. Therefore, an integrated circuit containing an MPGA may also have one or more functional blocks that have not been selected and are not electrically connected.

The programmable gate arrays in the preferred embodiments of this invention, i.e., the field or mask programmable gate arrays, allow a customer to independently specify, i.e., to program, the functionality of the gate array by specifying three functional variables: the combination of the logic cells to be selected from a bank of selectable functions, the sequence that that these selected logic cells are connected, and the routing of the inputs and outputs of the gate array.

In the preferred embodiments, at least one of the inputs and outputs of the I/O can be field programmable, mask programmable, or, not programmable (fixed). If the I/O is mask programmable, the integrated circuit would contain a plurality of input circuit blocks and output circuit blocks. The I/O can be customized in the design of the I/O and incorporated into the manufacturing process by defining the interconnects and selecting certain input circuit blocks and output circuit blocks from the bank of selectable input and output circuit blocks in the integrated circuit. In the alternative, if the I/O is field programmable, the I/O can be designed such that it can be customized and programmed after the integrated circuit is manufactured.

Figure 1:
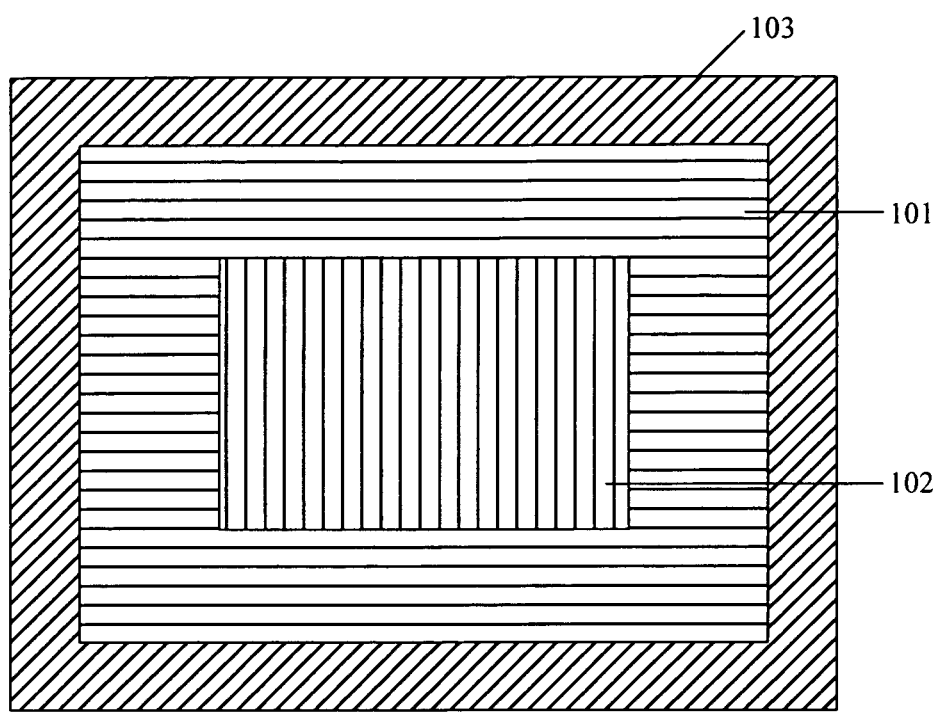
FIG. 1 is an illustration of an architecture of the integrated circuits of this invention.

Embodiments of this invention can have a variety of topology containing a combination of FPGAs and MPGAs. One preferred topology is where an FPGA is integrated with the MPGA in a ring structure. An example of such a FPGA and MPGA combination for a hybrid integrated circuit is illustrated in FIG. 1. The MPGA (101) is ring shaped and encloses and completely surrounds the FPGA (102). The I/O circuitry (103) is separated from said FPGA by said MPGA. Said I/O can be field programmable, mask programmable, or, not programmable. The I/O, whether non-programmable, mask programmable or field programmable, can be placed at the rim of the integrated circuit. However, it is not necessary for said I/O to completely surround or enclose said MPGA. The FPGA and MPGA for a topology such as that illustrated in FIG. 1 can be of any shape or size where in the preferred embodiments the MPGA encloses the FPGA.

Additional FPGAs or MPGAs can be inserted into the design of FIG. 1. For example, additional FPGAs can be inserted into the MPGA in FIG. 1. The FPGAs can also be mask programmable. Additional MPGAs or FPGAs can also separate the MPGA in FIG. 1 and the I/O.

Figure 3:
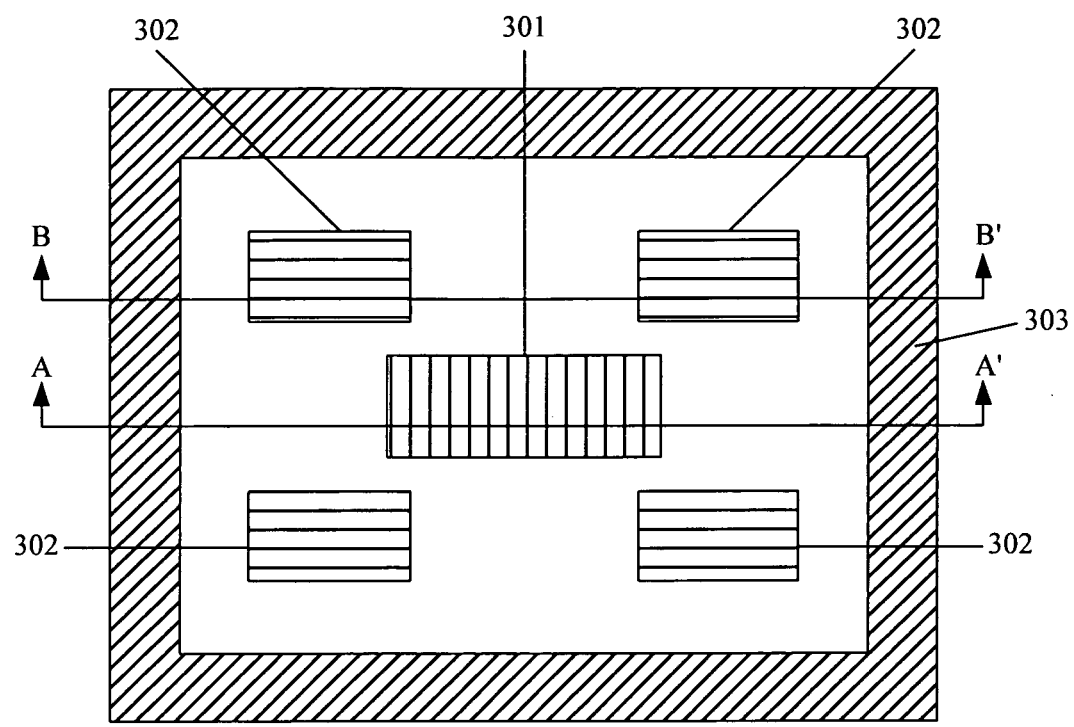
FIG. 3 is an illustration of an architecture of integrated circuits of this invention.

Another preferred embodiment contains one or more FPGAs and one or more MPGAs. Each of the programmable gate array in this preferred embodiment provide a customer the flexibility to independently specify, i.e., to program, the functional variables of a gate array, including the combination of the logic cells to be selected from a bank of selectable functions, the sequence that these selected logic cells are connected, and the routing of the inputs and outputs of the gate array. One or more of the MPGAs or the FPGAs can contain functional blocks that can function as clocks, processors, counters, shift registers, arithmetic units, etc. FIG. 3 is an illustration of an embodiment of the present invention with one MPGA (301), multiple FPGAs (302), and I/O (303) surrounding said MPGA and FPGAs. The I/O can be non-programmable, mask programmable, or field programmable.

The integrated circuits with architectures that are preferred embodiments of the present invention may be fabricated in three sets of layers. Each set of layers can contain one or more layers. Each layer in any of the sets of layers contain portions of the I/O, the MPGAs, and the FPGAs, i.e., portions of that layer that will form the I/O, the MPGAs, and the FPGAs in the finished hybrid integrated circuit. The first set of layers, referred to herein as the wafer bank layers, contain the circuitry for the functional and circuit blocks that provide the variety of functionality that this integrated circuit with this architecture can have and that the customer can select from. The functional blocks in the wafer bank layers may or may not be connected and may or may not be operable or functional until connected by the second set of layers.

The wafer bank layers contain a plurality of functional blocks that can be selected by the designer/customer before manufacturing. The wafer bank layers are usually designed by the vendor, designer or manufacturer of the integrated circuit. Often, this set of layers is pre-fabricated and available for further fabrication into a completed integrated circuit designed for the individual customers. If the I/O is mask programmable, then it may contain a bank of input circuit blocks and output circuit blocks that the customer can select from. If the I/O is field programmable, then it contains the circuit elements for the field programmable I/O.

The second set of layers, also referred to as the interconnect layers, connect and interconnect the elements and/or the functional blocks constructed by the first set of layers as well as any circuitry and connections that may be contained in the third set of layers. Many or all of these interconnect layers are metallization layers or via layers. The interconnect layers for the MPGA portion of this integrated circuit can be customized and designed for or by a customer. Customizing the interconnect layers allows a customer to use the interconnect layers to specify the interconnections for the selected functional blocks, i.e., the interconnections of the functional blocks with each other and with the circuitry in the integrated circuits, and select the functionality that it desires from the bank of selectable functional blocks in the wafer bank layers. Similarly, if the I/O portion of the integrated circuit is mask programmable, then, the interconnections in the interconnect layers can be designed to select and interconnect certain input and output circuit blocks. These interconnections may also interconnect certain input and output circuit blocks with a portion of the functional blocks in the wafer bank layers, including but not limited to the selected functional blocks selected by the customer.

The third set of layers also referred to as finishing layers, and contains layers such as insulation layers, protective layers, interconnects, and pad layers. These layers complete the integrated circuit and result in a finished product.

Figure 2:
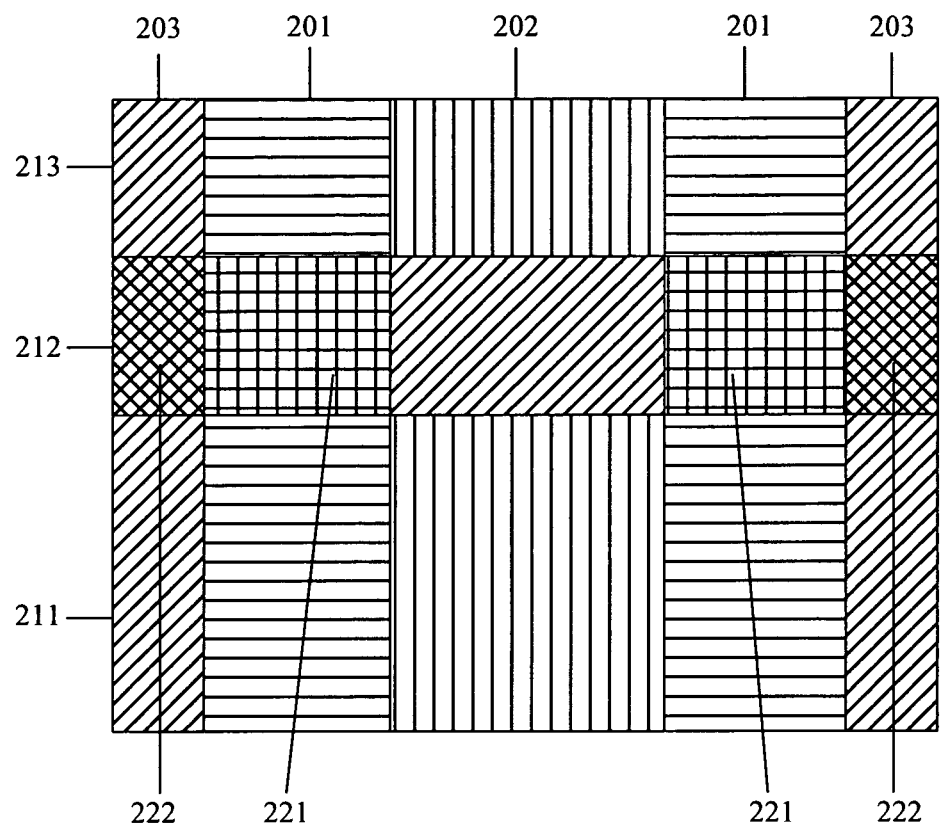
FIG. 2 is a cross sectional illustration of an architecture of the integrated circuits of this invention.

FIG. 2 is an illustration of a cross section of an architecture of an integrated circuit that is a preferred embodiment described above and illustrated in FIG. 1. The MPGA portions are indicated at 201, the FPGA portion is indicated at 202, and the I//O portions are indicated at 203. The wafer bank layers are called out at 211, the interconnect layers are called out at 212, and the finishing layers are called out at 213. The interconnect layers for the MPGA portion of the integrated circuit, 221, are mask programmable and designed for or by the customer. Similarly, if the I/O is mask programmable, the interconnect layers for the I/O portions, indicated at 222, are mask programmable and can be designed for or by the customer.

Furthermore, FIG. 2 illustrates the connection between the different set of layers of the FPGA, the MPGA, and the I/O, and the topology of thereof. The physical placement of the elements in the FPGA, MPGA, and I/O for the topology in FIG. 1 may be varied for different embodiments.

Figure 4:
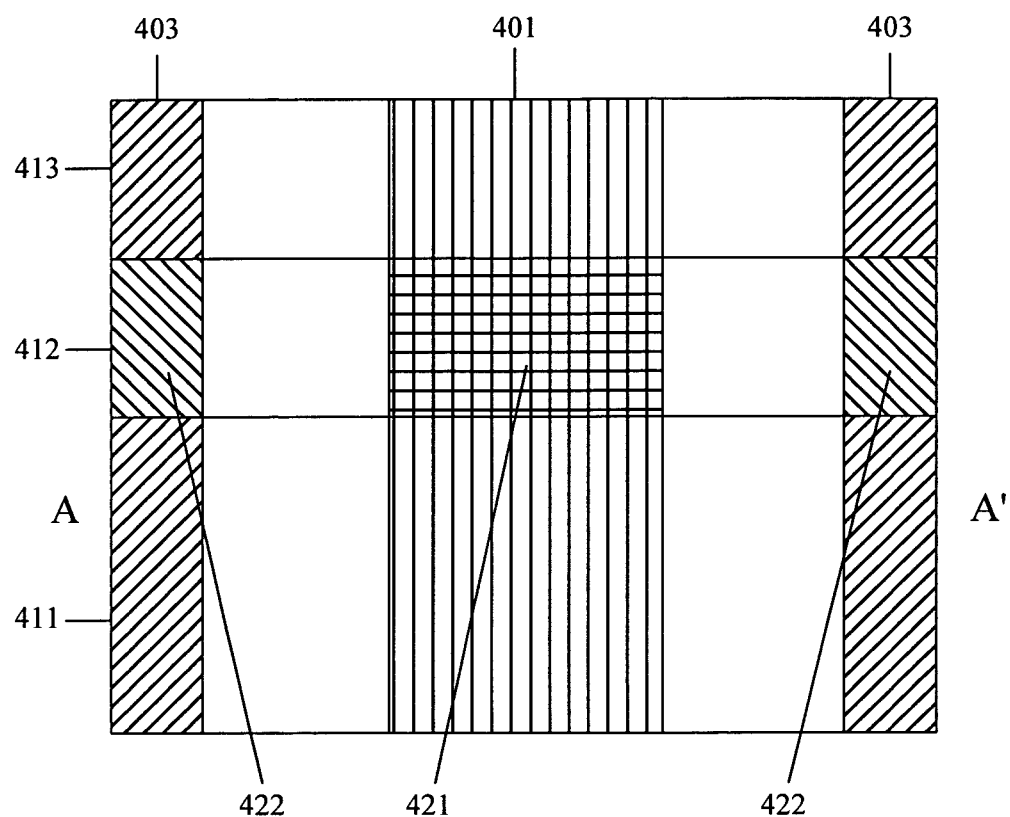
FIG. 4 is a cross sectional illustration of an architecture of the integrated circuits of this invention.

FIG. 4 shows the A-A' cross section of the architecture of an integrated circuit that is a preferred embodiment described above and illustrated in FIG. 3. The I/O portions are indicated at 403 and the MPGA portion is indicated at 401. The FPGA portion of the circuit is not observable in this cross-sectional view. The wafer bank layers are indicated at 411, the interconnect layers are indicated at 412, and the finishing layers are indicated at 413. The interconnect layers for the MPGA portion of the integrated circuit (421) are mask programmable and designed for or by the customer. Similarly, if the I/O is mask programmable, then the interconnect layers for the I/O portion (422) is mask programmable and can be designed for or by the customer.

FIG. 4 is a cross-sectional illustration of the embodiment that is shown in FIG. 3. It illustrates the connection between the different sets of layers of the FPGA, the MPGA, and the I/O and the topology of the FPGA, the MPGA, and the I/O. The physical placement of the elements in the FPGA, MPGA, and I/O for the topology in FIG. 3 may differ as long as the elements in the layers are connected in the manner illustrated in FIG. 4.

Figure 5:
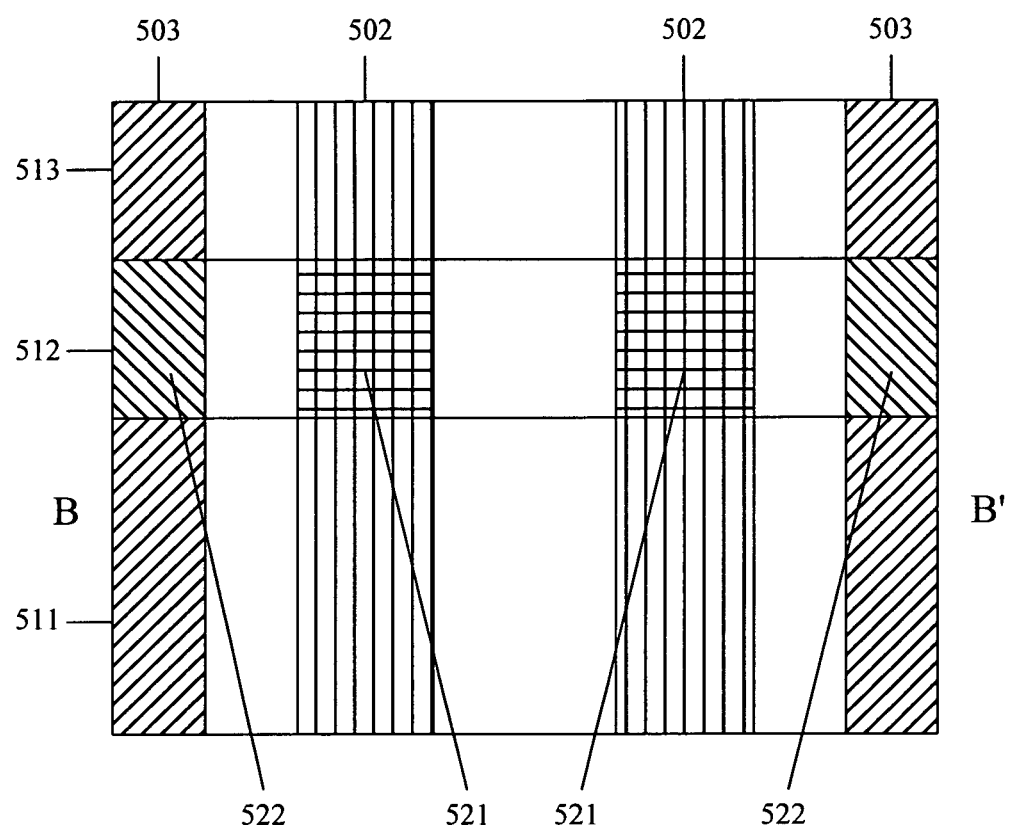
FIG. 5 is another cross sectional illustration of an architecture of integrated circuits of this invention.

FIG. 5 shows the B-B' cross-sectional illustration of the architecture of an integrated circuit that is a preferred embodiment described above and illustrated in FIG. 3. The I/O portions are indicated at 503 and FPGA portions are indicated at 502. The MPGA portion of the circuit is not observable in this cross-sectional view. The wafer bank layers are indicated at 51 1, the interconnect layers are indicated at 512, and the finishing layers are indicated at 513. The interconnect layers for the FPGA portion are indicated at 521. If the I/O is mask programmable, then the interconnect layers for the I/O portion (522), are mask programmable and can be designed for or by the customer. As in FIG. 4, FIG. 5 is a cross-sectional illustration of the embodiment that is shown in FIG. 3. It illustrates the connection between the different set of layers of the FPGA, the MPGA, and the I/O and the topology of the FPGA, the MPGA, and the I/O. The physical placement of the elements in the FPGA, the MPGA, and the I/O for the topology in FIG. 3 may differ as long as the elements in the layers are connected in the manner illustrated in FIG. 5.

The methods for the production or fabrication of a customized integrated circuit that are embodiments of this invention includes the following steps:

designing wafer bank layers and finishing layers of said integrated circuit, wherein said wafer bank layers provide a plurality of selectable functional blocks and said integrated circuit is field programmable;

fabricating said wafer bank layers;

designing mask programmed interconnect layers for said integrated circuit, wherein said interconnect layers interconnect selected ones of the plurality of functional blocks from said wafer bank layers;

fabricating said interconnect layers on said wafer bank layers; and fabricating said finishing layers on said interconnect layers to produce said integrated circuit.

To produce the integrated circuits that are the embodiments of this invention using the methods of this invention, a designer first designs the wafer bank layers and the finishing layers. Often, the designer fabricates the wafer bank layers such that it is in stock even before a customer places an order. The customer specifies the interconnections to select certain functional blocks and the functionality of the finished integrated circuits. The interconnect layers and the finishing layers are then fabricated on the wafer bank layers to obtain the finished product.

If the I/O is mask programmable, then the wafer bank layers also provide a plurality of selectable input circuit blocks and output circuit blocks and the design of the interconnect layers connect selected ones of the input circuit blocks and output circuit blocks in the wafer bank layers.

If the I/O is field programmable, the portion of the wafer bank layers contains elements which are field programmable in the finished, customized integrated circuit.

Fabrication of a layer includes the making of the mask for that layer and using the mask to define the circuitry for that layer by depositing or removing materials involved in the fabrication of that layer. The cost of making a mask is high and the time to make multiple layers can be extensive. The above described methods have the advantage of MPGAs where the cost of the manufacturing is lower and the turn around time for producing the integrated circuit is fast. The wafer bank layers and the finishing layers can be stock layers that a designer has pre-designed for multiple customers. New masks for the wafer bank layers and the finishing layers do not need to be designed and fabricated for each new customer. Only a portion of the interconnect layers has to be customized. As a result, manufacturing costs are significantly lowered as only a portion of the masks for each of the interconnect layers need to be designed and fabricated. Moreover, as the wafer bank layers can be fabricated and ready for customization, only a limited number of layers are needed to be fabricated upon a customer order. Therefore, the time to obtain the finished integrated circuit is shorter.

The hybrid architectures of this invention are also more flexible than conventional integrated circuits that contain only MPGA or only FPGA. The MPGAs and/or the mask programmable I/O in these architectures afford a customer the flexibility to customize before manufacturing while the FPGAs and/or the programmable I/O give the customer flexibility to customize after manufacturing.

Adding an MPGA feature to an integrated circuit with FPGAs significantly increases the flexibility of an integrated circuit design and provides this hybrid integrated circuit with the advantages of ASICS as well as FPGAs. For example, MPGAs can be used as the routing fabric for the FPGA such that areas for wire routes between the elements in the FPGAs and the I/O can be reduced. Since the MPGAs are configurable with minimal manufacturing changes as only a portion of the interconnect masks has to be re-configured, changes in the routing fabric for an FPGA in an MPGA can be accomplished with low non-recoverable expenditures. Moreover, in integrated circuits such as the preferred embodiments illustrated in FIG. 1, the MPGA portion allows the inexpensive addition of logic elements and customized parts between the I/O and the FPGA while the FPGA portion continues to provide the field programming flexibility for the integrated circuit.

While the present invention has been described with reference to certain preferred embodiments, it is to be understood that the present invention is not limited to such specific embodiments. Rather, it is the inventor's contention that the invention be understood and construed in its broadest meaning as reflected by the following claims. Thus, these claims are to be understood as incorporating not only the preferred embodiments described herein but all those other and further alterations and modifications as would be apparent to those of ordinary skilled in the art.

We Claim:

1. A method for producing an integrated circuit having one or more field programmable gate arrays, and a plurality of inputs and outputs, comprising the steps of:
   designing wafer bank layers for said integrated circuit, wherein said wafer bank layers provide a plurality of selectable functional blocks;
   fabricating said wafer bank layers;
   designing mask programmed interconnect layers for said integrated circuit, wherein said interconnect layers interconnect selected ones of the plurality of the functional blocks and non-selected ones of the plurality of the functional blocks are not connected; fabricating said interconnect layers on said wafer bank layers; and
   fabricating finishing layers on said interconnect layers to produce said integrated circuit; and wherein at least one of said plurality of inputs and outputs is field programmable.

2. The method of claim 1 wherein said wafer bank layers also provide a plurality of selectable input circuit blocks and output circuit blocks and said interconnect layers interconnect selected ones of the plurality of the input circuit blocks and output circuit blocks with the selected ones of the plurality of the functional blocks.

3. The method of claim 1 wherein the integrated circuit is in a ring structure.

4. The method of claim 2 wherein the integrated circuit is in a ring structure.

5. The method of claim 3 wherein the integrated circuit has a FPGA (field programmable gate array) portion and a MPGA (mask programmable gate arrays) portion in a ring structure and wherein at least a part of the FPGA portion is inside the ring structure formed by the MPGA portion.

6. The method of claim 4 wherein the integrated circuit has a FPGA (field programmable gate array) portion and a MPGA (mask programmable gate arrays) portion in a ring structure and wherein at least a part of the FPGA portion is inside the ring structure formed by the MPGA portion.

7. The method of claim 1 wherein said wafer bank layers also provide a plurality of selectable input circuit blocks and output circuit blocks.

8. The method of claim 7 wherein the integrated circuit is in a ring structure.

9. The method of claim 8 wherein the integrated circuit has a FPGA portion and a MPGA portion in a ring structure and wherein at least a part of the FPGA portion is inside the ring structure formed by the MPGA portion.

10. An integrated circuit, comprising:
    a mask programmable gate array;
    a field programmable gate array; and
    a plurality of inputs and outputs connected to said mask programmable gate array and said field programmable gate array; and wherein
    said field programmable gate array is integrated with said mask programmable gate array in a ring structure; and wherein
    at least one of said plurality of inputs and outputs is field programmable;
    wherein said integrated circuit includes a set of wafer bank layers and a set of interconnect layers on said wafer bank layers;
    wherein said wafer bank layers provide a plurality of selectable functional blocks; and
    wherein said interconnect layers interconnect selected ones of the plurality of the functional blocks and non-selected selected ones of the plurality of the functional blocks are not connected.

11. The integrated circuit of claim 10, wherein said integrated circuit further includes a set of finishing layers on said set of interconnect layers.

12. The integrated circuit of claim 10 wherein said wafer bank layers also provide a plurality of selectable input circuit blocks and output circuit blocks.

13. The integrated circuit of claim 10 wherein said wafer bank layers also provide a plurality of selectable input circuit blocks and output circuit blocks and said interconnect layers interconnect selected ones of the plurality of the input circuit blocks and output circuit blocks with the selected ones of the plurality of the functional blocks.

14. An integrated circuit, comprising:
    a mask programmable gate array;
    a field programmable gate array; and
    a plurality of inputs and outputs connected to said mask programmable gate array and said field programmable gate array; and wherein
    said field programmable gate array is integrated with said mask programmable gate array in a ring structure;
    at least one of said plurality of inputs and outputs is field programmable;
    said integrated circuit having a set of wafer bank layers, a set of interconnect layers on said wafer bank layers, and a set of finishing layers on said set of interconnect layers;
    said wafer bank layers provide a plurality of selectable functional blocks;
    said interconnect layers interconnect selected ones of the plurality of the functional blocks;
    non-selected ones of the plurality of the functional blocks are not connected; and
    said wafer bank layers also provide a plurality of selectable input circuit blocks and output circuit blocks.

15. The method of claim 1, wherein the non-connected functional blocks are dormant.

16. The integrated circuit of claim 10, wherein the non-connected functional blocks are dormant.

17. The integrated circuit of claim 14, wherein the non-connected functional blocks are dormant.

18. The method of claim 1, wherein the selectable functional blocks of the wafer bank layers are not connected with each other prior to connection with the interconnect layer.

19. The integrated circuit of claim 10, wherein the selectable functional blocks of the wafer bank layers are not connected with each other prior to connection with the interconnect layer.

20. The integrated circuit of claim 14, wherein the selectable functional blocks of the wafer bank layers are not connected with each other prior to connection with the interconnect layer.

* * * * *